United States Patent
Go

(12) 
(10) Patent No.: US 6,731,377 B2
(45) Date of Patent: May 4, 2004

(54) LASER OUTPUT CONTROL METHOD, LASER APPARATUS AND EXPOSURE APPARATUS

(75) Inventor: Masato Go, Tokyo (JP)

(73) Assignee: Nikon Corporation, Tokyo (JP)

( * ) Notice: Subject to any disclaimer, the term of this patent is extended or adjusted under 35 U.S.C. 154(b) by 65 days.

(21) Appl. No.: 10/216,393

(22) Filed: Aug. 12, 2002

(65) Prior Publication Data

US 2002/0191172 A1 Dec. 19, 2002

Related U.S. Application Data

(63) Continuation of application No. 09/499,459, filed on Feb. 7, 2000, now abandoned.

(30) Foreign Application Priority Data

Feb. 10, 1999 (JP) .............................. 11-033515

(51) Int. Cl.$^7$ .......................... G03B 27/72; G03B 27/42
(52) U.S. Cl. .......................................... 355/69; 355/63
(58) Field of Search .............................. 355/53, 67–71; 250/548; 356/399–401

(56) References Cited

U.S. PATENT DOCUMENTS

| | | |
|---|---|---|
| 5,097,291 A | 3/1992 | Suzuki |
| 5,191,374 A | 3/1993 | Hazama et al. |
| 5,526,093 A | 6/1996 | Takahashi |
| 5,528,118 A | 6/1996 | Lee |
| 5,591,958 A | 1/1997 | Nishi et al. |
| 5,623,853 A | 4/1997 | Novak et al. |
| 5,627,627 A | 5/1997 | Suzuki |
| 5,728,495 A | 3/1998 | Ozawa |
| 5,914,773 A | 6/1999 | Kurosawa et al. |
| 6,011,612 A | 1/2000 | Go et al. |

FOREIGN PATENT DOCUMENTS

| | | |
|---|---|---|
| JP | A-2000-21717 | 1/2000 |
| WO | WO 99/08133 | 2/1999 |
| WO | WO 99/08156 | 2/1999 |
| WO | WO 99/28956 | 6/1999 |

*Primary Examiner*—Henry Hung Nguyen
(74) *Attorney, Agent, or Firm*—Oliff & Berridge, PLC

(57) ABSTRACT

The present invention relates to a method of controlling the output of laser pulses where laser pulses are continuously emitted while performing charging for each pulse. This method comprises: a pre-charging step for commencing charging for a next pulse with a previously set first charging voltage value as a target; a voltage computation step for computing a second charging voltage value required for the next pulse during the pre-charging step; and a fine charging step for continuing charging for the next pulse with the second charging voltage value as the target instead of the first charging voltage value, when the second charging voltage value is computed in the voltage computation step.

12 Claims, 3 Drawing Sheets

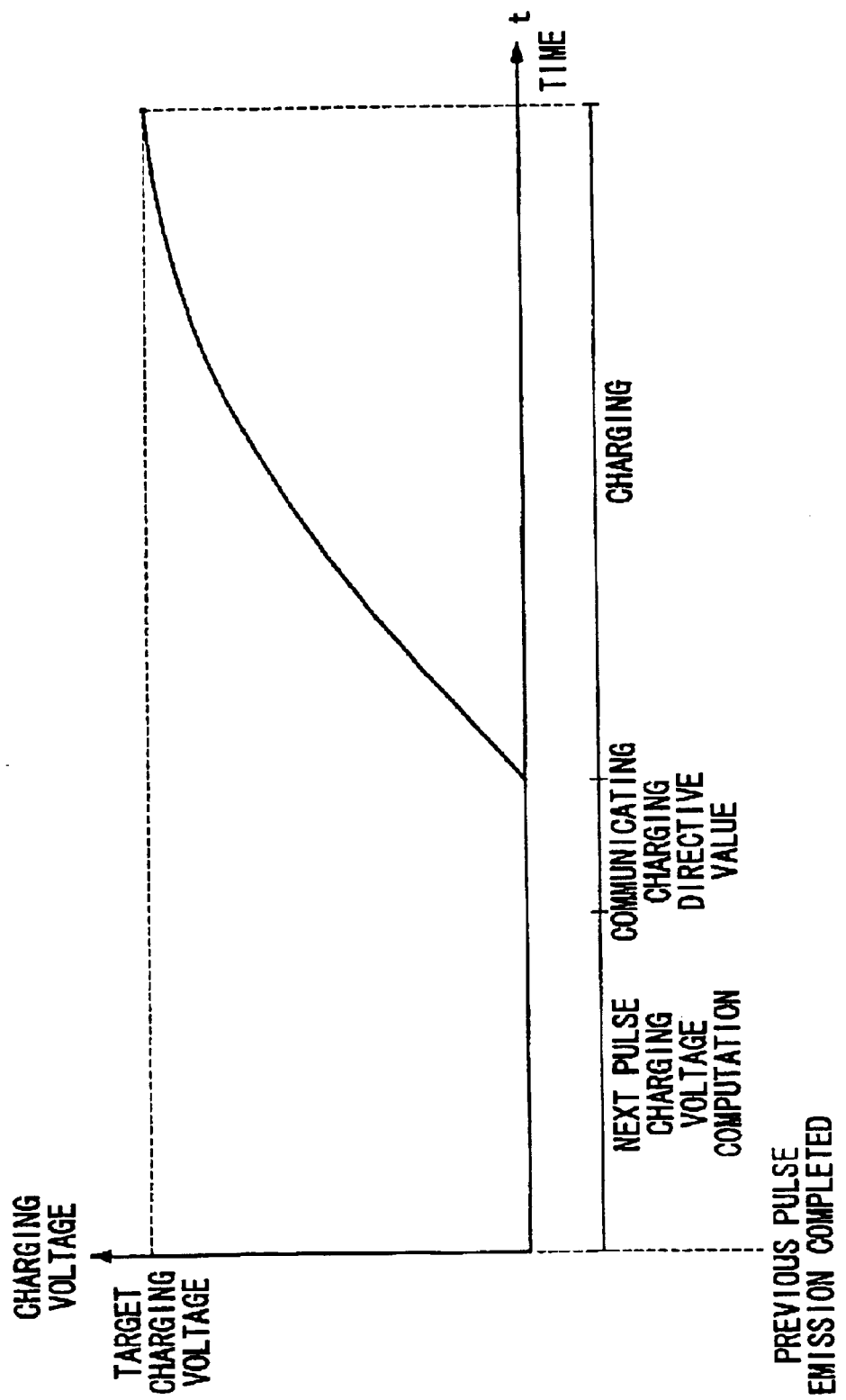

LASER OUTPUT CONTROL METHOD, LASER APPARATUS AND EXPOSURE APPARATUS

This is a Continuation of application Ser. No. 09/499,459 filed Feb. 7, 2000 now abandoned. The entire disclosure of the prior application(s) is hereby incorporated by reference herein in its entirety.

BACKGROUND OF THE INVENTION

1. Field of the Invention

The present invention relates to a laser output control method for controlling a laser apparatus such as an excimer laser apparatus which generates a laser pulse while performing charging for each pulse, and to a laser apparatus and an exposure apparatus which uses the laser apparatus as a pulse light source.

2. Description of the Related Art

Heretofore, at the time of producing devices such as semiconductor devices, liquid crystal display devices, image sensing devices (CCD etc.), or thin-film magnetic heads using a photolithography technique, a projection exposure apparatus has been used which projects an image of a pattern on a reticle constituting a mask, which is imaged via a projection optical system, onto a wafer (or glass substrate etc.) which has been coated with a photoresist or the like, to thereby expose the wafer.

In general, a pulse oscillation type laser apparatus, such as a KrF excimer laser apparatus or an ArF excimer laser apparatus, is used as a light source for the exposure apparatus, and is provided with a high voltage charging control unit having a charging circuit. In these pulse oscillation type laser apparatus, emission of a laser pulse is performed by charging a high voltage to the charging circuit for each pulse and then switching at a desired timing to discharge across two electrodes installed inside a gas chamber.

With such laser apparatus, in the case where charging is performed for each pulse, the following methods are adopted:

(1) a method where a target charging voltage value is given from outside of the laser apparatus; or (2) a method where a target energy value is given from outside the laser apparatus, and a target charging voltage value for the next pulse is computed inside the laser apparatus by executing computational processing, based on the history of the energy of laser pulses emitted from the laser apparatus, the gas condition inside the laser apparatus, and the value of the given target energy value.

Moreover, the charging operation for the next laser pulse is commenced at the following stages:

(1) the stage where the setting of the target charging voltage value from outside the laser apparatus is completed, or (2) the stage where the computation of the target charging voltage value inside the laser apparatus is completed.

Recently, with semiconductor exposure apparatus, in order to improve the number of wafers processed per unit time (throughput), a pulse oscillation type laser apparatus with a higher repetition frequency is required for the light source. On the other hand, it is also required to improve the accuracy and stability of the principal characteristics of each laser pulse such as the energy, wave length and half band width, so that with this there is an increasing trend for control of the laser interior to become more complicated, and for the processing time to increase. Hence, shortening of the time for charging ranks much greater importance.

However in the case where as mentioned above, emission of a laser pulse is performed at a high repetition frequency, the following problem remains. That is to say charging may be carried out at:

(1) a stage where the setting of the target charging voltage value from outside the laser apparatus is not completed, or (2) a stage where the computation of the target charging voltage value inside the laser apparatus is not completed, due to charging not being able to be commenced even though the timing for where charging must be started for the next pulse has eventuated, and the time related to charging being short. If this occurs, there is an undesirable situation such as the next laser pulse being emitted with there not being the required charging voltage value.

As a means of dealing with this problem the following has been considered:

(1) As a method of speeding up of the charging time itself, develop an improved charging apparatus, and shorten the charging time by modifying the hardware (laser apparatus).

(2) As a method of shortening the computation time for the target charging voltage value, and speeding up the setting timing for the energy directed from outside of the laser apparatus or for the target charging voltage value,
 a) shorten the time for computing the charging voltage inside the laser apparatus,
 b) shorten the time for computing the target charging voltage in the device outside the laser apparatus (speed up computation, simplify algorithms, increase interface speed etc.).

However, in the case where these means are used, the need arises to modify the equipment structure of the hardware such as the charging device and the computation circuit, with the problem of an increase in cost

SUMMARY OF THE INVENTION

The object of the present invention is to provide a laser output control method, a laser apparatus, and an exposure apparatus, each of which can shorten the time taken for charging for laser oscillation without modifying the equipment structure of hardware or the like.

Another object of the present invention is to provide an exposure apparatus which can improve the evenness of a cumulative exposure amount for a substrate such as a wafer.

The method of the present invention is for controlling the output of a laser pulse where laser pulses are continuously emitted while performing charging for each pulse, and this method comprises: a pre-charging step for commencing charging for a next pulse with a previously set first charging voltage value as a target; a voltage computation step for computing a second charging voltage value required for the next pulse during said pre-charging step; and a fine charging step for continuing said charging for the next pulse with said second charging voltage value as the target instead of said first charging voltage value, at the point when said second charging voltage value is computed in said voltage computation step.

On the other hand, the laser apparatus of the present invention is a laser apparatus which emits a laser pulse while performing charging for each pulse, and the apparatus comprises: a detector for detecting energy for each pulse; and a charging control system having a computer for computing a second charging voltage value required for a next pulse, which commences charging for said next pulse with a previously set first charging voltage value as the target, and during charging based on said first charging voltage value, computes using said computer a second charging voltage value required for said next pulse, based on the energy detected by said detector, and continues charging for said next pulse with said computed second charging voltage value as the target instead of said first charging voltage value, at the point when said second charging voltage value is computed.

Moreover, the present invention is an exposure apparatus provided with the abovementioned laser apparatus as a light source.

With the above laser output control method and laser apparatus, charging for the next pulse is commenced with a previously set first charging voltage value as the target, and during charging up until the first charging voltage value, the second charging voltage value required for the next pulse is computed. Furthermore, at the point when the second charging voltage value is computed, charging is continued with the second charging voltage value as the target instead of the first charging voltage value. Therefore charging can be commenced for the next pulse immediately after completion of the previous pulse emission. Moreover, since the target is switched from the first charging voltage value to the final second charging voltage value in a condition with a certain amount of charging, the time until completion of charging is considerably shortened.

Furthermore, since this is completed by only modifying the charging algorithm, without the necessity for modifying the equipment structure of the hardware etc., this can be realized at a low cost.

The exposure apparatus of the present invention is one where a mask is illuminated by pulse beams of a pulse light source and the pattern formed on the mask is transferred to a substrate, and incorporates the abovementioned laser apparatus as the pulse light source.

With this exposure apparatus, since the abovementioned laser apparatus is incorporated as the pulse light source, the pulse period can be shortened, and due to the resultant high light emission repetition frequency, an improvement in throughput can be realized. Moreover, the evenness of the cumulative exposure amount for the substrate can be improved.

BRIEF DESCRIPTION OF THE DRAWINGS

FIG. 3 is a graph showing a charging curve in a conventional example of a pulse light source in an exposure apparatus according to the present invention.

DESCRIPTION OF THE PREFERRED EMBODIMENTS

As follows is a description of one embodiment of an exposure apparatus which uses a laser apparatus according to the present invention, with reference to FIG. 1.

Figure 1:
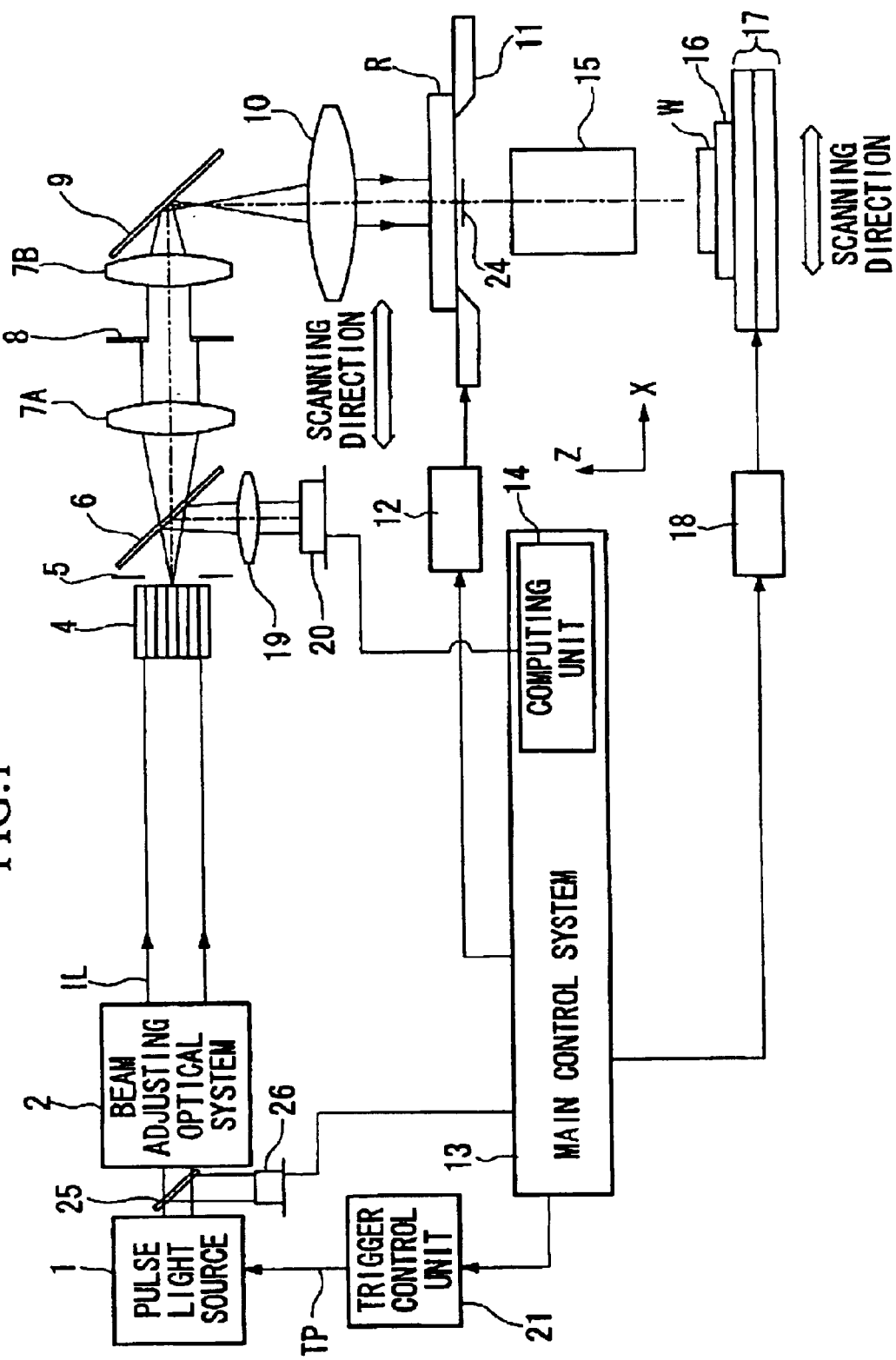
FIG. 1 is a general view illustrating an embodiment of an exposure apparatus according to the present invention.

FIG. 1 is a general view of an exposure apparatus of the embodiment. The exposure apparatus is a step-and-scan type exposure apparatus having a pulse light source (laser device) 1 being a pulse oscillation type exposure light source, as the light source. An example of a step-and-scan type exposure apparatus is disclosed in U.S. Pat. application Ser. No. 09/138,520 (filed on Aug. 28, 1998). This disclosure is incorporated by reference in the present specification.

As the pulse light source, an excimer laser light source which emits a laser pulse, such as a KrF excimer laser beam (248 nm wavelength) or an ArF excimer laser beam (193 nm wavelength) is used. The pulse light source 1 incorporates a charging control unit for performing charging for emitting laser pulses.

A laser beam IL is emitted from the pulse light source 1. The cross section shape of the laser beam IL is adjusted by a beam adjusting optical system 2 comprising a cylinder lens or a beam expander, so as to effectively enter a subsequent fly eye lens (optical integrator) 4.

The fly eye lens 4 forms a large number of secondary light sources for illuminating with an even illumination distribution, a subsequent field stop 8 and a reticle (mask) R. An aperture diaphragm 5 of an illumination system is positioned at the emission face of the fly eye lens 4, and the laser beam emitted from the secondary light source in the aperture diaphragm 5 impinges on a beam splitter 6. The laser beam which passes through the beam splitter 6, passes via a first relay lens 7a through an opening of the field stop 8 (fixed reticle blind).

The laser beam which has passed through the field stop 8 illuminates with an even distribution, the reticle R on a reticle stage 11 via a second relay lens 7B, an optical path bending mirror 9, and a main condenser lens 10.

The image of a pattern in an illumination region 24 on the reticle R, which is imaged via a projection optical system 15, is projected onto a wafer (substrate) W to thereby expose the wafer W. At this time, the reticle stage 11 is scanned in a scanning direction (in the direction of the arrow in FIG. 1) by a reticle stage drive unit 12.

The reticle stage drive unit 12 is controlled by a main control system 13 for generally controlling the operation of the overall apparatus. Furthermore, a measuring apparatus (reticle interferometer or the like) for detecting the coordinates (position information) in the scanning direction (X direction) of the reticle stage 11, is incorporated, and the coordinates in the scanning direction of the reticle stage 11 measured thereby, are supplied to the main control system 13.

On the other hand, the wafer W is mounted via a wafer holder 16 on an XY stage 17 which can be scanned at least in the scanning direction. A Z stage (not shown) or the like for positioning the wafer W in the Z direction, is disposed between the XY stage 17 and the wafer holder 16.

The laser beam reflected by the be splitter 6, is received via a collimator lens 19, by an integrator sensor 20 comprising a photoelectric conversion device (for example a PIN photodiode), and a photoelectric conversion signal from the integrator sensor 20 is supplied via an amplifier and an analog to digital converter (not shown in the figure), to a computing unit 14 inside the main control system 13.

The computing unit 14 measures variations in the pulse light amount of the pulse beam output from the pulse light source 1, by means of the photoelectric conversion signal from the integrator sensor 20, and integrates the photoelectric conversion signal for each of the pulse beams, to obtain a cumulative exposure amount at each point on the wafer W.

Moreover, the computing unit 14 computes the target charging voltage value required next for each pulse, based on the output from the integrator sensor 20.

A trigger control unit 21 is for supplying a trigger signal TP to the pulse light source 1. The trigger control unit 21 controls the timing of the emission of the laser pulse from the pulse light source 1 by supplying a trigger signal TP to the pulse light source 1 at a predetermined frequency (for example 4 KHz) by means of a directive from the main control system 13.

A beam splitter 25 is located on an optical path of the laser beam, between the pulse light source 1 and the beam adjusting optical system 2. The laser beam reflected by this beam splitter 25 is received by an energy monitor 26 comprising a photoelectric conversion device. A photoelectric conversion signal from the energy monitor 26 is supplied to the main control system 13 via an amplifier and analog to digital converter (not shown in the figure). The main control system 13 adjusts the output from the pulse light source 1 by means of the photoelectric conversion signal from the energy monitor 26.

Details of the construction of the pulse light source 1, and details of interchange of information between the pulse light source 1 and the integrator sensor 20, and the energy monitor 26 are disclosed for example in U.S. patent application Ser. No. 08/908,862 (filed on Aug. 8, 1997), U.S. patent application Ser. No. 09/034,870 (filed on Mar. 4, 1998) and U.S. patent application Ser. No. 09/081,374 (filed on May 19, 1998). These disclosures are incorporated by references in the present specification.

Figure 2:
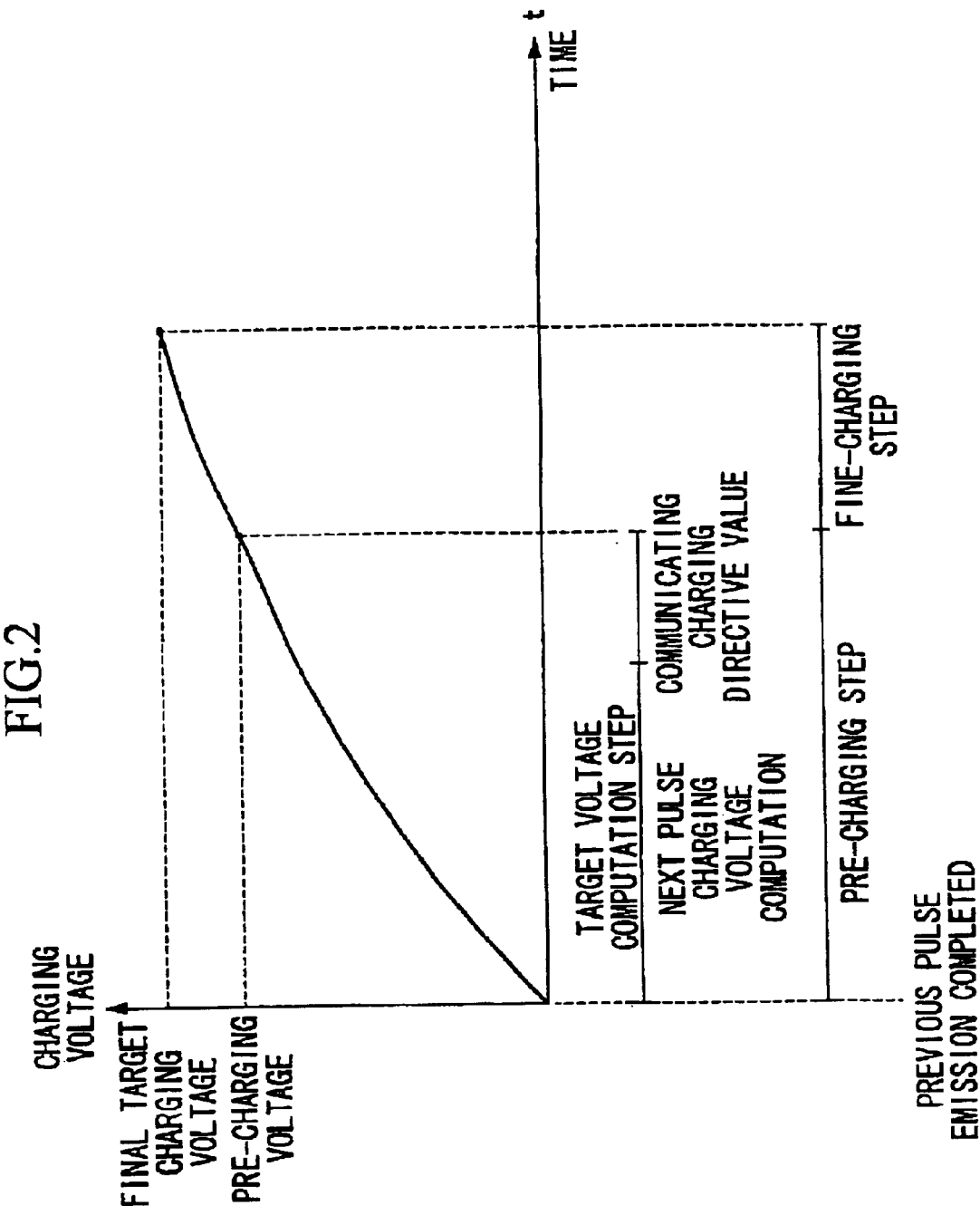
FIG. 2 is a graph showing a charging curve of a pulse light source in the embodiment of an exposure apparatus according to the present invention.

Next is a description with reference to FIG. 2 and FIG. 3, of a method of controlling the output from the pulse light source 1 by the main control system 13, for the case where a laser pulse is continuously emitted during scanning exposure of a wafer.

Pre-charging Step

After a previous pulse emission, as shown in FIG. 2, pre-charging of the pulse light source 1 by the charging control unit is commenced, with the minimum required charging voltage value to obtain the lower limit energy of the actually used level, that is to say, the lower limit value estimated as the voltage value set during exposure of the wafer W (temporary charging voltage value), as the target.

This lower limit value is estimated based on the number of laser pulses irradiated onto each point on the wafer W during exposure of the wafer W, and the sensitivity of the resist applied to the wafer W.

Target Voltage Computation Step

In parallel with the pre-charging operation of the pulse light source 1, the target charging voltage value for the next laser pulse is computed in the computing unit 14, based on the energy of one of the previous laser pulses detected by the integrator sensor 20.

The target charging voltage value for the next laser pulse may be based not only on the energy information for one of the previous laser pulses, but also on the past monitoring history (previous energy information of the energy of several laser pulses).

Fine Charging Step

When the target charging voltage value for the next pulse is computed, the target charging voltage value is transmitted from the main control system to the pulse light source 1. When the pulse light source 1 receives the target charging voltage value from the main control system 13, the pulse light source 1 corrects the charging target in the charging control system, from the temporary charging voltage value for pre-charging, to the target charging voltage value for the next pulse sent from the main control system 13, and the fine charging is continued.

When the charging voltage value has been reached to the desired target charging voltage value by fine charging, an output trigger signal TP is transmitted from the trigger control unit 21 to the pulse light source 1, and the pulse light source 1 emits a laser pulse of an energy corresponding to the charging voltage value.

In this way with the present embodiment, as shown in FIG. 2, charging (pre-charging) for the next pulse is initiated immediately after emission of the previous laser pulse, and when a certain amount of charging is performed, the target is switched from the temporary charging voltage value for pre-charging to the computed target charging voltage value. Therefore, the time between pulses for completing charging of the pulse light source 1 can be considerably shortened.

In particular, the time until completion of charging where the next target charging voltage value is determined based on the energy information of the previous laser pulse, can be considerably shortened.

Therefore, in the present embodiment, by shortening of the time for completion of charging for the next pulse, high repetition frequency of the laser output becomes possible. Hence the oscillation frequency of the laser pulse can be increased.

Moreover, the lower limit value estimated as the voltage value for setting during exposure of the wafer W, is used as the temporary charging voltage value for pre-charging. Therefore, it is possible to prevent the risk that charging voltage value due to pre-charging will exceed the finally computed target charging voltage value.

The reason the estimated lower limit value is determined based on the number of pulse beams irradiated onto each point of the wafer W during exposure of the wafer W, and the sensitivity of the resist applied to the wafer W, is so that the energy of each pulse beam actually irradiated is determined by the sensitivity of the resist, and bow many pulse beams are irradiated onto the resist.

In this way, by determining the temporary target charging voltage value for the pre-charging based on, the number of pulse beams irradiated onto each point of the wafer W during exposure of the wafer W, and the sensitivity of the resist applied to the wafer W, the difference between the temporary target charging voltage value and the finally computed target charging voltage value becomes small. Hence the time for fine charging can be even shorter.

The temporary target charging voltage value for the pre-charging may be determined in consideration of the mean value of the energy of the laser pulse emitted from the pulse light source 1, and the variations in the energy of the laser pulse emitted from the pulse light source 1.

Moreover, since charging is positively completed when the trigger signal TP is transmitted from the trigger control unit 21, a laser beam of the desired energy can always be emitted from the pulse light source 1. As a result, the cumulative exposure amount of the wafer W can be uniformed.

The present invention also includes the following embodiments.

(1) In the above embodiment, the target charging voltage value for each pulse is computed in the main control system 13, and the computed target charging voltage value is then transmitted to the pulse light source 1. However, the arrangement may be such that the target energy for the next laser pulse is transmitted from the main control system 13, and the target charging voltage value is computed inside the pulse light source 1 by converting the target energy amount to the target charging voltage value.

(2) In the above embodiment, the target charging voltage value for the pulse light source 1 is computed in the main control system 13 of the exposure apparatus. However, the arrangement may be such that a computing unit is provided inside the pulse light source 1, and the target charging voltage value is computed by the computing unit inside the pulse light source 1, based on an output from the integrator sensor 20.

(3) In the above embodiment, the target charging voltage value is computed based on the output from the integrator sensor 20. However, if the damping fluctuations in the energy of the laser light occurring between the pulse light source 1 and the integrator sensor 20 are small, the arrangement may be such that the target charging voltage value for the next pulse is computed based on the output from the energy monitor 26.

(4) As the exposure apparatus of the abovementioned embodiment, a step-and-repeat type exposure apparatus, where the pattern of the mask is exposed with the mask and substrate stationary, and the substrate is then moved in sequential steps, is also applicable.

(5) As the exposure apparatus of the abovementioned embodiment, a proximity exposure apparatus for exposing a pattern of a mask with the mask and substrate close together, without using a projection optical system, is also applicable.

(6) As a use for the exposure apparatus, this is not limited to an exposure apparatus for semiconductor manufacture, and may also be widely applied for example to liquid crystal exposure apparatus for exposing a liquid crystal display device pattern on a rectangular glass substrate, or an exposure apparatus for manufacturing thin film magnetic heads.

(7) The light source for the exposure apparatus of the above-mentioned embodiment may be not only a KrF excimer laser (248 nm), an ArF excimer laser (193 nm), or an $F_2$ laser (157 nm), but also a charged particle ray such as an X-ray may be used.

(8) The magnification of the projection optical system may be not only a reducing system, but may be either of an equal magnification system and an enlarging system.

(9) In the case where far infrared radiation rays such as from an excimer laser are used for the projection optical system, a material which passes far ultraviolet rays such as quartz or fluorite may be used for the glass material, while in the case where an $F_2$ laser or X-rays are used, a catadioptric or a dioptric optical system (in this case, the reticle should be a reflective type device) may be used.

(10) In the case where a linear motor (refer to U.S. Pat. No. 5,623,853, or U.S. Pat. No. 5,528,118) used for the wafer stage or the reticle stage, either an air flotation type using an air bearing or a magnetic levitation type using Lorentz force or reactance force may be used. Moreover, the stage may be a type which moves along a guide, or a guideless type which is not provided with a guide.

(11) The reaction force generated by the movement of the wafer stage may be mechanically dispersed to the floor (ground) using a frame member (as disclosed in U.S. Pat. No. 5,528,118).

(12) The reaction force generated by the movement of the reticle stage may be mechanically discharged to the floor (or ground) using a frame member (as disclosed in U.S. patent application Ser. No. 416,558).

(13) The exposure apparatus of the present embodiment may be manufactured by incorporating into the exposure apparatus, an illumination optical system and a projection optical system comprising a plurality of lenses, for optical adjustment. Then fitting a reticle stage and a wafer stage comprising a plurality of mechanical components, to the exposure apparatus body, and connecting wiring and piping, and then making an overall adjustment (electrical adjustment, mechanical adjustment and the like). Preferably the manufacture of the exposure apparatus is performed in a clean room in which the temperature and cleanliness etc. are controlled.

(14) The semiconductor device is manufactured through steps such as: a step for designing the functions and performance of the device; a step for manufacturing a reticle, based on this design step; a step for manufacturing a wafer from a silicon material; a step for exposing a pattern of the reticle on a wafer using the exposure apparatus of the beforementioned embodiment, a step for assembling the device (including a dicing step, a bonding step and a packaging step), and an inspection step.

With the abovementioned embodiments, charging is commenced for the next laser pulse with a previously set temporary charging voltage value as a target. A target charging voltage value required for the next pulse is then computed during charging up to the temporary charging voltage value. Then, at the point when the target charging voltage value is computed, charging is continued with the computed target charging voltage value as the target value instead of the temporary charging voltage value. Therefore, charging for the next pulse can be commenced immediately, and switched to fine charging during the charging. Hence the time until completion of charging can be greatly shortened. Therefore charging control with a surplus in process time is possible, and a system capable of high switching light emission from an energy control point of view can be realized.

Furthermore, since this can be completed by only modifying the charging algorithm, without the necessity for modifying the equipment construction of the hardware etc., then this can be realized at a low cost.

Moreover, the target charging voltage value is computed based on the energy information for at least one pulse which has been previously oscillated, that is to say, by considering the pulse history. Therefore, variations in the energy of each pulse can be suppressed, and in the case where the pulse is used in a light source for an exposure apparatus, an appropriate cumulative exposure amount can be obtained.

Furthermore, by providing the abovementioned laser apparatus as a pulse light source for an exposure apparatus, the pulse time can be reduced, and due to the high emission switching frequency, an improvement in throughput can be achieved Moreover, in the case where the voltage directive and energy directive is given for each pulse, it is possible to relax the time wise restriction.

Furthermore according to the abovementioned embodiment, the estimated fixed lower limit value for the voltage value set during exposure of the substrate is used as the temporary charging voltage value. Therefore, there is no likelihood of the temporary charging voltage value exceeding the finally computed target charging voltage value. Hence even in the case where the computing time is long, stabilized control of the laser output is possible.

Moreover, the estimated lower limit value is determined based on the number of laser pulses irradiated onto each point of the substrate during exposure of the substrate, and the sensitivity of the resist applied to the substrate. Therefore, this can be set to a temporary voltage value corresponding to the energy of each pulse beam required for actual irradiation.

What is claimed is:

1. A method of controlling the output of laser pulses where laser pulses are continuously emitted while performing charging for each pulse, said method comprising the steps of:

commencing charging for a next pulse emission prior to deciding a target charging voltage value for the next pulse emission, computing the target charging voltage value for the next pulse emission during said charging for the next pulse emission, and emitting the next pulse after a charging voltage value reaches the target charging voltage value for the next pulse emission.

2. A method of controlling the output of laser pulses according to claim 1, wherein said target charging voltage value for the next pulse emission is computed based on the energy information for at least one pulse which has been previously emitted.

3. A method of controlling the output of laser pulses according to claim 1, wherein a predetermined first charging voltage value is set as a target in the commencing charging step.

4. A laser apparatus which emits laser pulses while performing charging for each pulse, comprising:

a charging control system having a computing unit which computes a target charging voltage value for a next pulse emission, that commences charging for the next pulse emission prior to computing of the target charging voltage value for the next pulse emission by the computing unit; and a trigger control unit, connected to the charging control system, that controls timing of the emission to emit the next pulse after a charging voltage value for the next pulse emission reaches the target charging voltage value.

5. A laser apparatus according to claim 4, wherein the computing unit computes the target charging voltage value for the next pulse emission based on energy information for at least one pulse which has been previously emitted.

6. A laser apparatus according to claim 4, wherein the charging control system sets a predetermined first charging voltage value as a target when commencing charging for the next pulse emission prior to computing of the target charging voltage value for the next pulse emission by the computing unit.

7. An exposure apparatus that exposes a substrate comprising the laser apparatus as claimed in claim 6.

8. An exposure apparatus according to claim 7, wherein the computing unit estimates a lower limit value of a voltage value used during exposure of the substrate, and this lower limit value of the voltage value is used as the first charging voltage value.

9. An exposure apparatus according to claim 7, wherein the first charging voltage value is determined based on the sensitivity of a resist on the substrate.

10. An exposure apparatus according to claim 7, wherein the first charging voltage value is determined based on the number of pulses irradiated onto each point on the substrate during the exposure.

11. An exposure apparatus according to claim 7, further comprising:

an optical member for evenly illuminating said substrate; and a detector for detecting energy for each pulse at least one part of the detector being disposed between said optical member and said substrate, wherein the computing unit computes the target charging voltage value for the next pulse emission based on the energy detected by the detector.

12. A method for controlling the output of laser pulses, said method comprising the steps of:

charging for a next pulse emission and simultaneously computing a target charging voltage value for the next pulse emission immediately after completion of the previous pulse emission; and emitting the next pulse after a charging voltage value for the next pulse emission reaches the target charging voltage value.

* * * * *